United States Patent [19]
Yano et al.

[11] Patent Number: 5,556,585
[45] Date of Patent: Sep. 17, 1996

[54] DIELECTRIC CERAMIC BODY INCLUDING TIO2 DISPERSION IN CRYSTALLIZED CORDIERITE MATRIX PHASE, METHOD OF PRODUCING THE SAME, AND CIRCUIT BOARD USING THE SAME

[75] Inventors: Shinsuke Yano, Nagoya; Hirofumi Yamaguchi, Komaki; Takami Hirai, Aichi-ken, all of Japan

[73] Assignee: NGK Insulators, Ltd., Japan

[21] Appl. No.: 361,710

[22] Filed: Dec. 22, 1994

Related U.S. Application Data

[60] Continuation of Ser. No. 93,004, Jul. 19, 1993, abandoned, which is a division of Ser. No. 733,633, Jul. 22, 1991, Pat. No. 5,262,595.

[30] Foreign Application Priority Data

Jul. 25, 1990 [JP] Japan ..................................... 2-196528
Jul. 25, 1990 [JP] Japan ..................................... 2-196529

[51] Int. Cl.[6] .............................................. C04B 35/195
[52] U.S. Cl. .................................. 264/56; 501/9; 501/32
[58] Field of Search ................................. 264/56; 501/69, 501/9, 32

[56] References Cited

U.S. PATENT DOCUMENTS

| | | | |
|---|---|---|---|
| 2,920,971 | 1/1960 | Stookey | 501/69 |
| 5,013,605 | 5/1991 | Gritz | 501/69 |

*Primary Examiner*—James Derrington
*Attorney, Agent, or Firm*—Parkhurst, Wendel & Burr. L.L.P.

[57] ABSTRACT

A dielectric ceramic body prepared by firing a mixture of a cordierite glass powder and a $TiO_2$ powder, or a mixture of these powders and a $RE_2Ti_2O_7$ powder (RE representing a rare earth element), wherein particles of the $TiO_2$ powder or particles of the $TiO_2$ powder and the $RE_2Ti_2O_7$ powder are dispersed in a matrix phase of crystalline cordierite produced from the fired cordierite glass powder. In the first case, the cordierite glass powder and the $TiO_2$ powder have a proportion which satisfies $70 \leq x < 100$, $0 < y \leq 30$, and $x+y=100$, where x and y represent contents in weight % of the cordierite glass powder and said $TiO_2$ powder, respectively. In the second case, the cordierite glass powder, $TiO_2$ powder and the $RE_2Ti_2O_7$ powder have a proportion which satisfies $50 \leq x < 100$, $0 < y \leq 30$, $0 < z \leq 40$, and $x+y=100$, where z represents a content in weight % of the $RE_2Ti_2O_7$ powder.

5 Claims, 1 Drawing Sheet

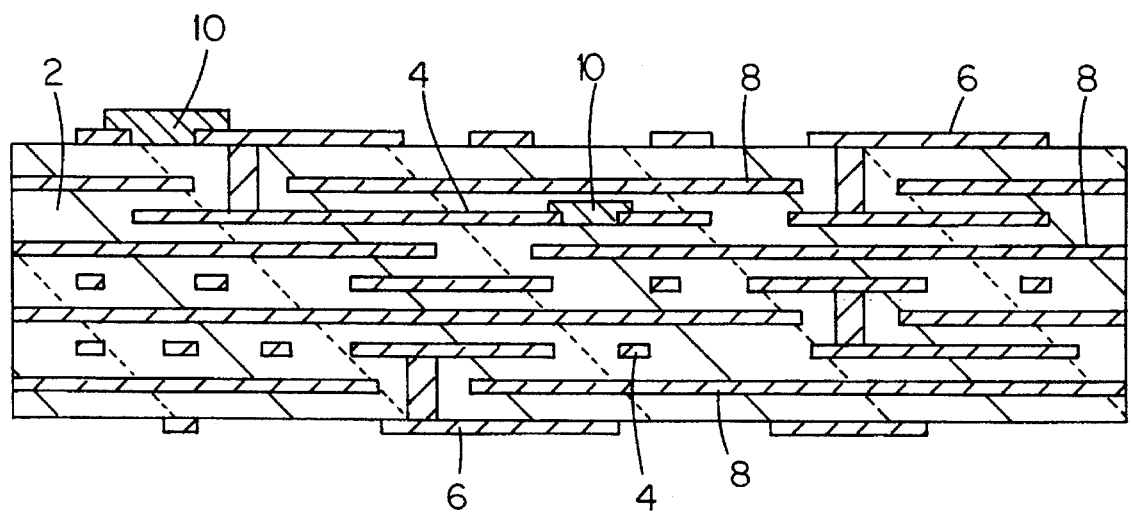

DIELECTRIC CERAMIC BODY INCLUDING TIO2 DISPERSION IN CRYSTALLIZED CORDIERITE MATRIX PHASE, METHOD OF PRODUCING THE SAME, AND CIRCUIT BOARD USING THE SAME

This is a Continuation of application Ser. No. 08/093,004 filed Jul. 19, 1993, now abandoned, which in turn is a Division of application Ser. No. 07/733,633 filed Jul. 22, 1991, which issued as U.S. Pat. No. 5,262,595.

BACKGROUND OF THE INVENTION

1. Field of the Invention

The present invention relates in general to a dielectric ceramic body, a method of producing the dielectric ceramic body, and a circuit board which uses the dielectric ceramic body. More particularly, the present invention is concerned with a dielectric ceramic body suitable for high-frequency circuit boards such as microwave integrated circuit (MIC) boards, a method of producing such a dielectric ceramic body, and such a microwave circuit board using a dielectric ceramic body.

2. Discussion of the Prior Art

Keeping pace with recent developments of various microwave devices such as pocket or portable telephones, there has been a dielectric growing demand for small-sized high-performance MIC boards used in such devices. In particular, a dielectric ceramic used to form a ceramic substrate for such MIC boards is required to have the following physical and strutural features:

(1) The dielectric ceramic should have a sufficiently high specific dielectric constant ($\epsilon r$), to reduce the size of a resonance circuit, an inductance element and a capacitor of a MIC board, when the board is operated at a given frequency.

(2) The dielectric ceramic should have a sufficiently high Q value, to increase the Q value of the resonance circuit and inducatance element of the MIC board.

(3) The temperature coefficient of the dielectric constant of the dielectric ceramic, and the temperature coefficient of the resonance frequency of the resonance circuit should be sufficiently low.

(4) The dielectric ceramic should permit conductor patterns to be formed in a multi-layered or multi-level structure.

(5) Further, an electrically conductive composition used to form the conductor patterns should have a sufficiently low resistivity. In this respect, it is noted that an increase in the resistivity of the conductor patterns reduces the Q value of the resonance circuit and inducatance element of the MIC board, thereby resulting in an increase in transmission loss of the conductors.

There have been known various dielectric ceramic compositions for the ceramic substrates for such MIC boards, such as: a dielectric ceramic composition as disclosed in laid-open Publication No. 58-20905 of examined Japanese Patent Application, whose major components consist of BaO and $TiO_2$, a portion of which may be substituted by another element or other elements; a dielectric ceramic composition as disclosed in laid-open Publication No. 59-23048 of examined Japanese Patent Application, which has a composite perovskite strucutre such as $Ba(Mg_{13}Ta_{23})O_3$; a dielectric ceramic composition as disclosed in laid-open Publication No. 54-35678 of examined Japanese Patent Application, whose major components consist of $TiO_2$, $ZrO_2$ and $SnO_2$, a portion of which may be substituted by another element or other elements; and a dielectric ceramic composition as disclosed in laid-open Publication No. 56-26321, whose major components consist of BaO, $TiO_2$ and $RE_2O_3$ (RE: rare earth element).

While the known dielectric ceramic compositions as described above have a relatively high dielectric constant, circuit boards using ceramic substrates formed of these ceramic compositions must use Pt, Pd or other electrically conductive materials which have a relatively high resistivity, where the internal conductor patterns are formed in a multi-level structure within the substrates. Namely, the firing or sintering temperatures of those dielectric ceramic compositions are so high that Ag, Cu, Au or other conductive materials having a sufficiently low resistivity cannot be used for the internal multi-level conductor patterns.

For the ceramic substrates, there are also known inexpensive ceramic compositions such as alumina, steatite and forsterite. However, these ceramic compositions have excessively high temperature coefficients, and undesirably limit the choice of the conductive material for the internal multi-level conductor patterns, to Pt, Pd, W, Mo or other conductors having high resistivity values.

SUMMARY OF THE INVENTION

The present invention was developed in the light of the prior art situations described above. It is accordingly a first object of the invention to provide a dielectric ceramic body which has a sufficiently high dielectric constant and a sufficiently low resistivity, and which permits the use of an electrically conductive material having a sufficiently low resistivity, for internal conductor patterns formed therein in a multi-level or multi-layered structure.

A second object of the invention is to provide a method of producing such a dielectric ceramic body.

A third object of the invention is to provide a circuit board which uses such a dielectric ceramic body.

The present invention was completed based on findings obtained as a result of an extensive study on a variety of dielectric ceramic compositions.

The first object of the present invention is achieved according to a first aspect of the present invention, which provides a dielectric ceramic body prepared by firing a mixture of a cordierite glass powder and a $TiO_2$ powder, wherein particles of the $TiO_2$ powder are dispersed in a matrix phase of crystalline cordierite produced from the fired cordierite glass powder, and wherein the cordierite glass powder and the $TiO_2$ powder have a proportion which satisfies the following formulas:

$70 \leq x < 100$ $0 < y \leq 30$ $x+y=100$ where x and y represent contents in weight % of the cordierite glass powder and the $TiO_2$ powder, respectively.

The first object may also be achieved according to a second aspect of the present invention, which provides a dielectric ceramic body obtained by firing a mixture of a cordierite glass powder, a $TiO_2$ powder and a $RE_2Ti_2O_7$ powder (RE representing a rare earth element), wherein particles of the $TiO_2$ powder and the $RE_2Ti_2O_7$ powder are dispersed in a matrix phase of crystalline cordierite produced from the fired cordierite glass powder, and wherein the cordierite glass powder, the $TiO_2$ powder and the $RE_2Ti_2O_7$ powder has a proportion which satisfies the following formulas:

$50 \leq x < 100$ $0 < y \leq 30$ $0 < z \leq 40$ $x+y+z=100$ where x, y and z represent contents in weight % of the cordierite glass powder, the $TiO_2$ powder and the $RE_2Ti_2O_7$ powder, respectively.

The second object indicated above may be achieved according to a third aspect of the present invention, which provides a method of producing a dielectric ceramic body, comprising the steps of: preparing a mixture of a cordierite glass powder and a $TiO_2$ powder which have the respective contents x and y as specified above with respect to the first aspect of the invention; forming an unfired body by using the prepared mixture of the cordierite glass powder and the $TiO_2$ powder; and firing the unfired body at a temperature not higher than 1100° C., to thereby densify the mixture, and crystallize the cordierite glass powder for producing a cryatallized phase of cordierite as a matrix phase of the dielectric ceramic body produced.

The second object may also be achieved according to a fourth aspect of the present invention, which provides a method of producing a dielectric ceramic body, comprising the steps of: preparing a mixture of a cordierite glass powder, a $TiO_2$ powder and a $RE_2Ti_2O_7$ (RE representing a rare earth element) which have the respective contents x, y and z as specified above with respect to the second aspect of the invention; forming an unfired body by using the prepared mixture of the cordierite glass powder, the $TiO_2$ powder and $RE_2Ti_2O_7$; and firing the unfired body at a temperature not higher than 1100° C., to thereby densify the mixture, and crystallize the cordierite glass powder for producing a cryatallized phase of cordierite as a matrix phase of the dielectric ceramic body produced.

The third object indicated above may be achieved according to a fifth aspect of the present invention, which provides a circuit board having a dielectric body according to the first or second aspect of the present invention, and at least one conductor pattern formed within the dielectric body.

The dieletric ceramic body according to the present invention may further comprise up to 30 parts by weight in total of at least one filler powder each having a dielectric constant not higher than 30, per 100 parts by weight of the mixture of the cordierite glass powder and the $TiO_2$ powder, or per 100 parts by weight of the mixture of the cordierite glass powder, the $TiO_2$ powder and the $RE_2Ti_2O_7$ powder.

BRIEF DESCRIPTION OF THE DRAWINGS

The above object, features and advantages of the present invention will be better understood by reading the following detailed description of the invention, when considered in connection with the accompanying drawings, in which the signle figure is an elevational view in cross section of one form of a circuit board embodying the present invention.

DETAILED DESCRIPTION OF THE INVENTION

Where the major components of the dielectric ceramic powder mixture which gives the dielectric ceramic body according to the present invention include a cordierite glass powder and a $TiO_2$ powder, the contents x and y of these two components should be determined so as to satisfy the formulas indicated above. If the contents x and y do not fall within the respective specified ranges, the object of the invention cannot be fully achieved. More specifically, if the content x of the cordierite glass powder is smaller than 70% by weight while the content y of the $TiO_2$ powder exceeds 30% by weight, it becomes difficult to sinter the dielectric ceramic powder mixture at a sufficiently low temperature, i.e., 1100° C. or lower, at which the powder mixture can be sufficiently densified and the cordierite glass powder can be crystallized as needed.

Where the major components of the dielectric ceramic powder mixture include a cordierite glass powder, a $TiO_2$ powder and a $RE_2Ti_2O_7$ powder, the contents x, y and z of these three components should be determined so as to satisfy the formulas also indicated above. If the contents x, y and z do not fall within the respective specified ranges, the object of the invention cannot be fully achieved, either. For example, if the content x of the cordierite glass powder is smaller than 50% by weight, it becomes difficult to sinter the dielectric ceramic powder mixture at a temperature not higher 1100° C., and accordingly difficult to sufficiently densify the powder mixture. Further, the sufficient densification of the powder mixture and the crystallization of the cordierite glass powder are difficult, if the content y of the $TiO_2$ powder exceeds 30% by weight, or if the content z of the $RE_2Ti_2O_7$ powder exceeds 40% by weight.

The cordierite glass powder is used to give the produced dielectric ceramic body excellent microwave dielectric properties, and to permit the sintering of the dielectric ceramic powder mixture at a sufficiently low temperature. For this cordierite glass powder, any known cordierite glass composition which gives a primary crystal in the form of cordierite can be used as a rule. A preferred example of such cordierite glass composition consists of 25–65% by weight of $SiO_2$, 7–25% by weight of MgO, 10–45% by weight of $Al_2O_3$, and 0–20% by weight of $B_2O_3$. With the contents of $SiO_2$, MgO and $Al_2O_3$ held within the respective ranges specified above, the powder mixture can be effectively sintered and densified at 1100° C. or lower. If the content of $B_2O_3$ exceeds 20% by weight, the water-proofing property of the sintered dielectric ceramic body will be deteriorated. Optionally, the cordierite glass composition for the cordierite powder may further contain other components such as oxides of alkali metals, oxides of alkali earth metals, and metal oxides such as $ZrO_2$, ZnO and PbO, as needed to improve the sinterability of the dielectric ceramic powder mixture. Further, the cordierite glass composition may optionally contain Mn, Cr, Fe, Co, Ni, Cu, or oxides of rare earth elements, to suitably color the dielectric ceramic body produced., and also contain $TiO_2$ as a nucleus formation agent for promoting crystallization of the cordierite glass. This component $TiO_2$ of the cordierite glass powder should be distinguished from the $TiO_2$ powder, which cooperates with the cordierite glass powder to provide the dielectric ceramic powder mixture that gives the relevant dielectric ceramic body. The cordierite glass composition (cordierite glass powder) inevitably includes some amounts of impurities, during preparation of the cordierite glass.

The cordierite glass powder may be prepared from the cordierite glass composition as indicated above, which is produced in a suitable known process for producing glasses. Usually, the individual components of the glass are mixed in a suitable proportion to provide the desired cordierite glass composition, and the mixture is melted. The molten mixture is rapidly cooled into a glass, which is then crushed or ground into the intended cordierite glass powder. For improving the sinterability of this cordierite glass powder, the particle size of the cordierite glass powder is preferably 20 μm or smaller, more preferably about 1–10 μm.

According to the prsent invention, the $TiO_2$ powder is used to control or adjust the dielectric constant of the dielectric ceramic body produced, and the temperature coefficient of the resonance frequency of a resonance circuit formed by a conductor pattern carried by the dielectric ceramic body. The temperature coefficient of the resonance frequency increases as the content y of the $TiO_2$ power increases. If a dielectric ceramic body consists solely of a cordierite glass, the temperature coefficient of thr resonance frequency falls within a range between −80 ppm/° C. and −40 ppm° C. However, the addition of the $TiO_2$ powder will increase the temperature coefficient, even to a positive value. Since $TiO_2$ per se is a ceramic having a dielectric constant as high as about 100, the use of the $TiO^2$ powder with the cordierite glass powder makes it possible to increase the dielectric constant of the dielectric ceramic body produced.

Generally, a $TiO_2$ powder consists of extremely finely divided particles, and therefore tends to prevent the sinetering of the cordierite glass powder. If the content y of the $TiO_2$ powder exceeds 15% by weight, it is desirable to calcine this powder in order to enlarge the particle size to a suitable value. For example, the $TiO_2$ powder is calcined so that the particles of the calcined power have a BET specific surface area of not larger than about 2 $m^2/g$.

Where the major components of the dielectric ceramic powder mixture that gives a dielectric ceramic body includes the $RE_2Ti_2O_7$ powder in addition to the cordierite glass powder and the $TiO_2$ powder, the $RE_2Ti_2O_7$ powder serves to control the dielectric constant and the temperature coefficient of the resonance frequency of the dielectric ceramic body produced, like the $TiO_2$ powder. However, the $RE_2Ti_2O_7$ powder reduces the temperature coefficient of the resonance frequency, contrary to the $TiO_2$ powder which increases the temperature coefficient. Since the $RE_2Ti_2O_7$ powder has a dielectric constant as high as 40, the addition of this powder results in increasing the dielectric constant of the dielectric ceramic body produced.

For the rare earth element RE of the $RE_2Ti_2O_7$ powder, rare earth elements such as Sm, Nd, La, Pr and Y may be used. More specifically, the $RE_2Ti_2O_7$ powder is prepared by mixing $TiO_2$ with an oxide or oxides of at least one of these rare earth elements or a compound that gives such oxide(s), so as to establish a suitable mole ratio, then calcining the mixture and finally crushing or grinding the calcined mixture. The $RE_2Ti_2O_7$ powder may contain two or more rare earth elements.

The dielectric ceramic body is prepared by using the dielectric ceramic powder mixture whose major component consists of the cordierite glass powder and the $TiO_2$ powder, or alternatively by using the dielectric ceramic powder mixture which consists of the cordierite glass powder, the $TiO_2$ powder and the $RE_2Ti_2O_7$ powder. The contents x and y of the two major components, or the contents x, y and z of the three major components are suitably determined so as to determine the formulas indicated above. However, the dielectric ceramic powder may further include at least one filler powder which is selected for example from the group consisting of: alumina; quartz; mullite; forsterite; and quartz glass. Crystalline fillers such as alumina, quartz, mullite and forsterite have a dielectric constant not higher than 30, and will not considerably increase the dielectric constant of the dielectric ceramic body produced. However, alumina is effective to increase the strength of the dielectric ceramic body, while quartz, mullite and forsterite are effective to control the thermal expansion coefficient of the dielectric ceramic body. For this reason, these fillers are added as needed in suitable amounts. Further, a highly refractory glass such as quartz glass may be used like the above-indicated fillers whose dielectric constant is not higher than 30. The total amount of the at least one filler powder is up to 30 parts by weight per 100 parts by weight of the mixture of the cordierite glass powder and the $TiO_2$ powder, or per 100 parts by weight of the mixture of the cordierite glass powder, $TiO_2$ power and $RE_2Ti_2O_7$ powder. If the total content of the filler powder or powders exceeds 30 parts by weight, the dielectric ceramic composition cannot be sufficiently densified at a sintering temperature not higher than 1100° C.

To produce a dielectric ceramic body according to the present invention, a dielectric ceramic powder mixture is prepared by uniformly mixing the cordierite glass powder and the $TiO_2$ power, or uniformly mixing the cordierite glass powder, the $TiO_2$ power and the $RE_2Ti_2O_7$ powder, together with the selected filler powder or powders added as needed. The thus prepared powder mixture is then formed into an unfired body in a known manner, and the formed unfired body is fired and densified into the dielectric ceramic body, such that the cordierite glass composition is crystallized into a crystalline phase of cordierite. The thus produced dielectric ceramic body has the matrix phase in the form of the crystalline cordierite, in which the $TiO_2$ particles, or the $TiO_2$ and $RE_2Ti_2O_7$ particles are dispersed or distributed.

The firing to sinter the unfired body formed from the dielectric ceramic powder mixture is effected at 1100° C. or lower, for obtaining a highly dense fired body (dielectric ceramic body) which generally has a porosity of about 6%. The lower limit of the firing temperature is about 800° C. The crystallization of the cordierite glass composition occurs at a temperature between about 850° C. and about 1100° C., during the firing process. However, this crystallization may be effected in a subsequent process following the firing process. As a result of the crystallization of the cordierite glass composition, the produced dielectric ceramic body has the crystalline cordierite matrix phase in which the $TiO_2$ particles, or the $TiO_2$ and $RE_2Ti_2O_7$ particles are dispersed. While the primary crystal of the dielectric ceramic body consists of the cordierate, some crystalline phases of mullite, forsterite and spinel may be separated, depending upon the cordierite glass composition. The produced dieletric ceramic body unavoidably contains some amorphous phases.

When a circuit board using the above dielectric ceramic body as a ceramic substrate may be produced in a suitable known manner. Generally, ceramic green sheets are formed of the dielectric ceramic powder mixture whose major components include the cordierite glass powder and the $TiO_2$ powder, or these two components and the $RE_2Ti_2O_7$ powder. On these ceramic green sheets, conductor patterns are formed by printing or other technique, using pastes of suitable electrically conductive compositions. The thus prepared ceramic green sheets are laminated or superposed on each other, and compacted together into a stack. The stack of the green sheets with the conductor patterns are then co-fired so that an intended circuit board is obtained. Since the firing and crystallization of the ceramic green sheets are effected at a relatively low temperature not higher than 110° C., the conductor patterns may be formed of an electrically conductive composition whose major component or components is/are selected from the group consisting of: Ag; Ag-based alloys such as Ag—Pt, Ag—Pd and Ag—Pt—Pd; Cu; commercially available Cu-based alloys; Au; and Au-based alloys such as Au—Pt, Au—Pd and Au—Pt—Pd. These Ag, Cu, Au, and Ag—, Cu— and Au-based alloyws have relatively low resistivity values, and can be co-fired with the dielectric ceramic composition at 1100° C. or lower, at which those electrically conductive materials are not melted. Accordingly, the circuit board using the dielectric ceramic body as the substrate may contain internal conductor patterns whose resistivity is sufficiently low.

Referring to the cross sectional view of the drawings, there is shown one form of a circuit board which is produced as described above according to the present invention. In this figure, reference numeral 2 denotes a dielectric ceramic body formed by firing of a dielectric ceramic composition whose major components include a cordierite glass powder and a $TiO_2$ powder, or these two components and a $RE_2Ti_2O_7$ powder. Within the dielectric ceramic body 2 and on the surfaces of the body 2, there are provided various conductor patterns, which include internal conductors 4 embedded or buried in the body 2, external conductors 6 formed on the surfaces of the body 2, and earth conductors 8 buried in the body 2. These conductors 4, 6, 8 are formed in a multi-level or multi-layered fashion and carried by the dielectric ceramic body 2. The present circuit board further includes suitable resistors 10 which are embedded in or formed on the body 2.

Since the dielectric ceramic body 2 of the thus constructed circuit board uses the dielectric ceramic mixture powder which can be sintered and crystallized at a relatively low temperature of 1100° C. or lowe, the conductor patterns (4, 6, 8) may be formed of electrically conductive materials such as Ag— or Cu-based alloys having a sufficiently low resistivity, which can be co-fired with the dielectric ceramic composition for the dielectric ceramic body 2, even where the conductor pattersn (4, 8) are embedded or buried in the dielectric body 2.

EXAMPLES

To further clarify the concept of the present invention, some examples of the invention will be described. It is to be understood that the invention is not limited to the details of the illustrated examples, but may be embodied with various alterations, modifications and improvements, which may occur to those skilled in the art, without departing from the scope of the invention defined in the appended claims.

EXAMPLE 1

Measured amounts of raw materials such as MgO, $Al_2O_3$, $SiO_2$ and $H_3BO_3$ which give each of cordierite glass compositions No. 1 through No. 17 as indicated in TABLE 1 were sufficiently mixed in an alumina pot, and the mixture was melted in a platinum crusible at 1600° C. The melt was introduced into water and was thereby rapidly cooled into a cordierite glass. Each of the thus obtained glasses was wet-ground into a powder form in an alumina pot using alumina balls, and the powder was dried. Thus, the cordierite glass powders having the respective compositions of TABLE 1 were prepared.

TABLE 1

| Glass No. | Cordierite Glass Composition (wt. %) | | | | | |
|---|---|---|---|---|---|---|
| | MgO | $Al_2O_3$ | $SiO_2$ | $B_2O_3$ | $ZrO_2$ | Other Components |
| 1 | 13.4 | 34 | 50.1 | 2.5 | — | — |
| 2 | 12.4 | 31.4 | 46.2 | 10.0 | — | — |
| 3 | 11.6 | 29.6 | 43.6 | 15 | — | — |
| 4 | 9.5 | 28.5 | 57.0 | 5 | — | — |
| 5 | 19 | 38 | 38 | 5 | — | — |
| 6 | 19 | 38 | 38 | 2 | 3 | — |
| 7 | 11.1 | 33.1 | 48.8 | 5 | — | CaO: 2 |
| 8 | 11.1 | 33.1 | 48.8 | 5 | — | SrO: 2 |
| 9 | 11.1 | 33.1 | 48.8 | 5 | — | BaO: 2 |
| 10 | 13.1 | 33.1 | 48.8 | — | 5 | — |
| 11 | 13.1 | 33.1 | 48.8 | 3 | — | ZnO: 2 |
| 12 | 13.1 | 33.1 | 48.8 | 3 | — | $Na_2O$: 2 |
| 13 | 13.1 | 33.1 | 48.8 | 3 | — | $K_2O$: 2 |
| 14 | 13.1 | 33.1 | 48.8 | 3 | — | $Li_2O$: 2 |
| 15 | 23.8 | 42.7 | 28.5 | 4 | — | $Li_2O$: 1 |
| 16 | 18 | 27 | 45 | 5 | — | $TiO_2$: 5 |
| 17 | 19 | 19 | 52 | 5 | 5 | — |

The thus prepared cordierite glass powders of TABLE 1 were wet-mixed with a $TiO_2$ powder, in various proportions indicated by the contents x and y (parts by weight) in TABLE 2, whereby dielectric ceramic compositions No. 1 through 29 were prepared. For the dielectric ceramic compositions Nos. 10–15, a filler powder as indicated in TABLE 2 was added. The mixing was conducted in a polyethylene pot using alumina balls. After each mixture was dried, polyvinyl alcohol (PVA) was added as a binder, which was uniformly mixed with the mixture. The thus obtained mixtures were passed through a 40-mesh shieve, whereby dielectric ceramic mixture powders Nos. 1–29 as indicated in TABLE 2 were prepared. These dielectric ceramic mixture powders were subjected to a press-forming operation under surface pressure of 1 ton/cm², to prepare respective samples of circular discs, each of which have a diameter of 20 mm and a thickness of 12 mm. The samples were air-dried, and then fired for 30 minutes at a temperature of 900°–1000° C. The fired samples were ground to a final size of 16 mm diameter and 8 mm thickness.

The thus prepared samples (Nos. 1–29) of dielectric ceramic body in the form of discs were tested to measure the dielectric constant and the non-load Q value, according to Hakki & Coleman method. Also, the temperature coefficients (τf) of the resonance frequency of the samples over a range of −25° C. to 75° C. were measured. The measured

TABLE 2

| Dielectric Ceramic No. | Glass No. | Glass (x) | TiO$_2$ (y) | Filler | Content | Dielectric Constant | Q Value | τf (ppm/°C.) |
|---|---|---|---|---|---|---|---|---|
| 1 | 1 | 85 | 15 | — | — | 6.9 | 600 | 8 |
| 2 | 2 | 85 | 15 | — | — | 6.9 | 600 | 7 |
| 3 | 3 | 85 | 15 | — | — | 6.9 | 550 | 8 |
| 4 | 4 | 85 | 15 | — | — | 6.7 | 550 | 9 |
| 5 | 5 | 95 | 5 | — | — | 5.9 | 1000 | −29 |
| 6 | 5 | 90 | 10 | — | — | 6.4 | 900 | −10 |
| 7 | 5 | 85 | 15 | — | — | 7.3 | 900 | 9 |
| 8 | 5 | 80 | 20 | — | — | 8.2 | 800 | 26 |
| 9 | 5 | 75 | 25 | — | — | 8.8 | 1000 | 44 |
| 10 | 5 | 95 | 5 | Al$_2$O$_3$ | 25 | 6.4 | 1000 | −27 |
| 11 | 5 | 90 | 10 | Al$_2$O$_3$ | 10 | 6.8 | 1000 | −11 |
| 12 | 5 | 80 | 20 | Al$_2$O$_3$ | 5 | 8.3 | 1000 | 25 |
| 13 | 5 | 85 | 15 | Quartz | 5 | 7.4 | 1000 | 6 |
| 14 | 5 | 85 | 15 | Mullite | 5 | 7.3 | 600 | 7 |
| 15 | 5 | 85 | 15 | Quartz glass | 5 | 7.4 | 900 | 8 |
| 16 | 6 | 85 | 15 | — | — | 7.4 | 900 | 8 |
| 17 | 7 | 85 | 15 | — | — | 7.1 | 550 | 9 |
| 18 | 8 | 85 | 15 | — | — | 7.0 | 600 | 7 |
| 19 | 9 | 85 | 15 | — | — | 7.1 | 700 | 8 |
| 20 | 10 | 85 | 15 | — | — | 7.0 | 900 | 6 |
| 21 | 11 | 85 | 15 | — | — | 6.8 | 800 | 10 |
| 22 | 12 | 85 | 15 | — | — | 7.0 | 900 | 8 |
| 23 | 13 | 85 | 15 | — | — | 6.8 | 900 | 9 |
| 24 | 14 | 85 | 15 | — | — | 6.8 | 800 | 7 |
| 25 | 15 | 95 | 5 | — | — | 5.9 | 600 | −28 |
| 26 | 16 | 90 | 10 | — | — | 6.9 | 900 | −1 |
| 27 | 17 | 90 | 10 | — | — | 6.0 | 900 | −8 |
| 28 | 5 | 65 | 35 | — | — | Not densified | | |
| 29 | 5 | 100 | 0 | — | — | 5.4 | 1000 | −48 | values are indicated in TABLE 2. The measurements were made over the frequency range of 8–12 GHz. The Q values indicated in the table are those at 10 GHz.

It will be understood from TABLE 2 that the dielectric ceramic bodies according to the present invention, namely, samples Nos. 1–27, are sintered bodies which were sufficiently densified by firing at 900°–1000° C. and showed improvements in the dielectric constant, Q value and resonance frequency temperature coefficient (τf). On the other hand, the comparative samples Nos. 28 and 29 were not sufficiently densified at the firing temperature of 900°–1000° C.

EXAMPLE 2

The dielectric ceramic mixture powder No. 7 used in Example 1 was well mixed with acrylic organic binder, plasticizer, toluene and alcohol solvent, in an alumina pot using alumina balls, whereby a slurry was prepared. By using this slurry, ceramic green tapes having thickness of 0.1–1.0 mm were formed by doctor-blading technique.

In the meantime, a conductor paste to be used for printing conductive wiring patterns on the green tapes was prepared by well mixing an Ag-based powder, acrylic organic binder and terpineol organic solvent, by a kneader using three rolls. For forming resistor patterns, a commercially available resistor paste for thick-film circuits was prepared.

By using these conductor and resistor pastes, suitable conductive wiring patterns, earth layers and resistor patterns were printed on the appropriate green tapes indicated above. Then, suitable conductor patterns which form a desired resonance circuit of stripline type or ring type and a desired inductance element were printed on the green tapes, according to the pattern of a capacitor and the principle of a distributed constant circuit. Thereafter, the green tapes on which these conductor and resistor patterns were printed were laminated on each other in a predetermined order, and then compacted at a temperature of 100° C., under 100 kg/cm$^2$. The thus formed multi-level conductor and resistor patterns separated by the green tapes were interconnected through a conductive paste which fills through-holes formed through the individual green tapes by punching, for example. Subsequently, the stack of green tapes was heat-treated at 500° C. so as to remove the binder therefrom, and then fired at 900° C. for 30 minutes., whereby the cordierite glass composition was crystallized. Thus, a circuit board constructed as shown in the drawing was obtained.

On the surfaces of the thus prepared circuit board, there were formed external conductor and resistor patterns, by using a commercially available thick-film forming Ag/Pt- or Ag/Pd-based paste, and a commercially available Cu paste. These external patterns were formed after the firing of the ceramic substrate consisting of the green tapes, for improving the patterning accuracy, adhesion force and soldering resistance.

Thus, there was produced a multi-level microwave integrated circuit (MIC) board containing a resonance circuit, a capacitor and other elements buried within the dielectric ceramic substrate, with the conductor patterns (Ag-based alloys) having a sufficiently low resistivity, so as to assure minimum loss of the resonance circuit, capacitor and inductance element, and minimum transmission loss of the transmission line. The multi-level MIC board exhibited excellent high-frequency or microwave characteristics.

EXAMPLE 3

In the same manner as in Example 1, the cordierite glass powders Nos. 1–18 having the respective compositions of TABLE 3 were prepared. It is noted that the cordierite glass powders Nos. 1–15 of TABLE 3 are the same as the powders Nos. 1–15 of TABLE 1, respectively while the powders Nos. 17 and 18 of TABLE 3 are the same as the powders Nos. 16 and 17 of TABLE 1, respectively, and that the powder No. 16 of TABLE 3 has a cordierite glass composition not found in TABLE 1.

In the meantime, various oxides of rare earth elements such as neodium oxide were wet-mixed with titanium oxide ($TiO_2$), in proportions as indicated in TABLE 4. The mixtures were dried, and then calcined in an alumina crucible at 1300° C. The calcined mixtures were wet-crushed in an alumina pot using alumina balls, and the obtained powdered mixtures were dried.

The prepared cordierite glass powders of TABLE 3 were wet-mixed with the powdered mixtures of $TiO_2$ and $RE_2Ti_2O_7$ such as $Nd_2Ti_2O_7$, in various proportions indicated by the contents x, y, z (parts by weight) in TABLE 4, whereby dielectric ceramic compositions No. 1 through 34 were prepared. For the dielectric ceramic compositions Nos. 10–12 and 16–18, a filler powder as indicated in TABLE 4 was added. The mixing was conducted in a polyethylene pot using alumina balls. After each mixture was dried, polyvinyl alcohol (PVA) was added as a binder, which was uniformly mixed with the mixture. The thus obtained mixtures were passed through a 40-mesh shieve, whereby dielectric ceramic mixture powders Nos. 1–34 as indicated in TABLE 4 were prepared. These dielectric ceramic mixture powders were subjected to a press-forming operation to prepare respective samples of circular discs, as in Example 1.

TABLE 3

| Glass No. | Cordierite Glass Composition (wt. %) | | | | | |
|---|---|---|---|---|---|---|
| | Mgo | $Al_2O_3$ | $SiO_2$ | $B_2O_3$ | $ZrO_2$ | Other Components |
| 1 | 13.4 | 34 | 50.1 | 2.5 | — | — |
| 2 | 12.4 | 31.4 | 46.2 | 10.0 | — | — |
| 3 | 11.6 | 29.6 | 43.6 | 15 | — | — |
| 4 | 9.5 | 28.5 | 57.0 | 5 | — | — |
| 5 | 19 | 38 | 38 | 5 | — | — |
| 6 | 19 | 38 | 38 | 2 | 3 | — |
| 7 | 11.1 | 33.1 | 48.8 | 5 | — | CaO:2 |
| 8 | 11.1 | 33.1 | 48.8 | 5 | — | SrO:2 |
| 9 | 11.1 | 33.1 | 48.8 | 5 | — | BaO:2 |
| 10 | 13.1 | 33.1 | 48.8 | — | 5 | — |
| 11 | 13.1 | 33.1 | 48.8 | 3 | — | ZnO:2 |
| 12 | 13.1 | 33.1 | 48.8 | 3 | — | $Na_2O$:2 |
| 13 | 13.1 | 33.1 | 48.8 | 3 | — | $K_2O$:2 |
| 14 | 13.1 | 33.1 | 48.8 | 3 | — | $Li_2O$:2 |
| 15 | 23.8 | 38 | 33.2 | 4 | — | $Li_2O$:1 |
| 16 | 23.8 | 42.7 | 28.5 | 4 | — | $Li_2O$:1 |
| 17 | 18 | 27 | 45 | 5 | — | $TiO_2$:5 |
| 18 | 19 | 19 | 52 | 5 | 5 | — |

TABLE 4

| Dielectric Ceramic No. | Dielectric Ceramic Composition (Parts by weight) | | | | | | | properties | | |
|---|---|---|---|---|---|---|---|---|---|---|
| | Glass No. | Glass (x) | $TiO_2$ (y) | $RE_2Ti_2O_7$ | | Other components | | Dielectric Constant | Q Value | τf (ppm /°C.) |
| | | | | RE | Content (Z) | Filler | Content | | | |
| 1 | 1 | 80 | 15 | Nd | 5 | — | — | 7.6 | 500 | 2 |
| 2 | 2 | 80 | 15 | Nd | 5 | — | — | 7.6 | 550 | 0 |
| 3 | 3 | 80 | 15 | Nd | 5 | — | — | 7.6 | 600 | −2 |
| 4 | 4 | 80 | 15 | Nd | 5 | — | — | 7.6 | 550 | 0 |
| 5 | 5 | 80 | 15 | Nd | 5 | — | — | 8.0 | 550 | −1 |
| 6 | 5 | 73 | 17 | Nd | 10 | — | — | 8.5 | 750 | 10 |
| 7 | 5 | 73 | 17 | La | 10 | — | — | 8.5 | 730 | 11 |
| 8 | 5 | 73 | 17 | Sm | 10 | — | — | 8.5 | 770 | 10 |
| 9 | 5 | 73 | 17 | Pr | 10 | — | — | 8.5 | 750 | 10 |
| 10 | 5 | 94 | 5 | Nd | 1 | $Al_2O_3$ | 25 | 6.5 | 800 | −34 |
| 11 | 5 | 90 | 5 | Nd | 5 | $Al_2O_3$ | 10 | 6.8 | 770 | −36 |
| 12 | 5 | 85 | 10 | Nd | 5 | $Al_2O_3$ | 5 | 7.5 | 1000 | −20 |
| 13 | 5 | 75 | 24 | Nd | 1 | — | — | 8.8 | 800 | 38 |
| 14 | 5 | 65 | 5 | Nd | 30 | — | — | 8.7 | 650 | −43 |
| 15 | 5 | 95 | 4 | La | 1 | — | — | 6.0 | 720 | −32 |
| 16 | 5 | 90 | 5 | La | 5 | Quartz | 5 | 6.4 | 800 | −35 |
| 17 | 5 | 90 | 5 | La | 5 | Mullite | 5 | 6.4 | 800 | −32 |
| 18 | 6 | 90 | 5 | Sm | 5 | Quartz glass | 5 | 6.4 | 720 | −31 |
| 19 | 7 | 80 | 15 | Nd | 5 | — | — | 8.0 | 900 | −2 |
| 20 | 8 | 80 | 15 | Nd | 5 | — | — | 7.8 | 500 | −3 |
| 21 | 9 | 80 | 15 | Nd | 5 | — | — | 7.7 | 500 | −2 |
| 22 | 10 | 80 | 15 | Nd | 5 | — | — | 7.8 | 450 | 0 |
| 23 | 11 | 80 | 15 | Nd | 5 | — | — | 7.8 | 600 | 3 |
| 24 | 12 | 80 | 15 | Nd | 5 | — | — | 7.6 | 600 | 2 |
| 25 | 13 | 80 | 15 | Nd | 5 | — | — | 7.7 | 500 | 0 |
| 26 | 14 | 80 | 15 | Nd | 5 | — | — | 7.6 | 500 | 2 |
| 27 | 15 | 80 | 15 | Nd | 5 | — | — | 9.6 | 500 | −2 |

TABLE 4-continued

| Dielectric Ceramic No. | Dielectric Ceramic Composition (Parts by weight) | | | | | | properties | | |
| --- | --- | --- | --- | --- | --- | --- | --- | --- | --- |
| | Glass No. | Glass (x) | TiO$_2$ (y) | RE$_2$Ti$_2$O$_7$ | | Other components | Dielectric Constant | Q Value | τf (ppm /°C.) |
| | | | | RE | Content (Z) | Filler | Content | | | |
| 28 | 16 | 90 | 5 | Nd | 5 | — | — | 6.5 | 600 | −30 |
| 29 | 17 | 90 | 5 | Nd | 5 | — | — | 7.2 | 700 | −20 |
| 30 | 18 | 88 | 10 | Nd | 2 | — | — | 6.5 | 900 | −8 |
| 31 | 5 | 100 | 0 | — | 0 | — | — | 5.4 | 1000 | −48 |
| 32 | 5 | 65 | 32 | Nd | 3 | — | — | Not densitied | | |
| 33 | 5 | 53 | 2 | Nd | 45 | — | — | " | | |
| 34 | 5 | 45 | 25 | Nd | 31 | — | — | " | | |

The thus prepared samples (Nos. 1–34) of dielectric ceramic body in the form of discs were tested to measure the dielectric constant, the non-load Q value, and the temperature coefficients (τf) of the resonance frequency, in the same manner as in Example 1.

It will be understood from TABLE 4 that the dielectric ceramic bodies according to the present invention, namely, samples Nos. 1–30, are sintered bodies which were sufficiently densified by firing at 900°–1000° C. and showed improvements in the dielectric constant, Q value and resonance frequency temperature coefficient (τf). On the other hand, the comparative samples Nos. 31–34 were not sufficiently densified at the firing temperature of 900°–1000° C.

EXAMPLE 4

By using the dielectric ceramic mixture powder No. 5 of TABLE 4 used in Example 3, ceramic green tapes were formed in the same manner as in Example 2, and a multi-level MIC board as shown in the drawing was prepared by forming conductor and resistor patterns on the green tapes, as in Example 2. Like the MIC board of Example 2, the multi-level MIC board according to this example exhibited excellent high-frequency or microwave characteristics.

It will be apparent from the foregoing description that the dielectric ceramic body produced according to the principle of the present invention has a sufficiently high dielectric constant, a considerably reduced temperature coefficient of resonance frequency, and therefore permits the use of an electrically conductive material having a low resistivity, as internal conductor patterns formed therein. The dielectric ceramic composition which includes a cordierite glass as a major component exhibits excellent microwave dielectric properties, and is accordingly suitably used as a dielectric ceramic substrate for a microwave intergrated circuit board (MIC board).

What is claimed is:

1. A method of producing a dielectric ceramic body, comprising the steps of:

preparing a mixture of a cordierite glass powder and a TiO$_2$ powder which has a proportion satisfying formulas, $70 \leq x < 100$, $4 \leq y \leq 30$, and $x+y=100$, where x and y represent contents in weight % of said cordierite glass powder and said TiO$_2$ powder, respectively;

forming an unfired body which comprises the prepared mixture of said cordierite glass powder and said TiO$_2$ powder; and firing said unfired body at a temperature not higher than 1100° C., thereby to densify said mixture, and crystallize said cordierite glass powder to produce a crystallized matrix phase of cordierite, and a phase of TiO$_2$ particles which is dispersed in said matrix phase.

2. A method according to claim 1, further comprising the step of adding not more than 30 parts by weight in total of at least one filler powder to said mixture of said cordierite glass powder and said TiO$_2$ powder, per 100 parts by weight of said mixture so that said unfired body comprises said at least one filler powder, said at least one filler powder having a dielectric constant not higher than 30.

3. A method of producing a dielectric ceramic body, comprising the steps of:

preparing a mixture of a cordierite glass powder, a TiO$_2$ powder and a RE$_2$Ti$_2$O$_7$ (RE representing a rare earth element) which has a proportion satisfying formulas, $50 \leq x < 100$, $4 \leq y \leq 30$, $0 < z \leq 40$, and $x+y+z=100$, where x, y and z represent contents in weight % of said cordierite glass powder, TiO$_2$ powder and RE$_2$Ti$_2$O$_7$, respectively;

forming an unfired body which comprises the prepared mixture of said cordierite glass powder, said TiO$_2$ powder and RE$_2$Ti$_2$O$_7$; and firing said unfired body at a temperature not higher than 1100° C., thereby to densify said mixture, and crystallize said cordierite glass powder to produce a crystallized matrix phase of cordierite, and a phase of TiO$_2$ particles which is dispersed in said matrix phase.

4. A method according to claim 3, further comprising the step of adding not more than 30 parts by weight in total of at least one filler powder to said mixture of said cordierite glass powder, said TiO$_2$ powder and said RE$_2$Ti$_2$O$_7$ powder, per 100 parts by weight of said mixture so that said unfired body comprises said at least one filler powder, said at least one filler powder having a dielectric constant not higher than 30.

5. The method of claim 1, wherein $5 \leq y \leq 30$.

* * * * *